US 10,424,609 B2

United States Patent
Lee et al.

(10) Patent No.: US 10,424,609 B2
(45) Date of Patent: Sep. 24, 2019

(54) IMAGE SENSOR WITH REDUCED FIXED PATTERN NOISE

(71) Applicant: SK hynix Inc., Gyeonggi-do (KR)

(72) Inventors: Cha-Young Lee, Gyeonggi-do (KR); Sung-Wook Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 118 days.

(21) Appl. No.: 15/599,607

(22) Filed: May 19, 2017

(65) Prior Publication Data

US 2018/0130837 A1 May 10, 2018

(30) Foreign Application Priority Data

Nov. 8, 2016 (KR) .................... 10-2016-0148090

(51) Int. Cl.
*H01L 27/146* (2006.01)
*H01L 27/148* (2006.01)

(52) U.S. Cl.
CPC ...... *H01L 27/14605* (2013.01); *H01L 27/148* (2013.01); *H01L 27/14609* (2013.01); *H01L 27/14612* (2013.01); *H01L 27/14621* (2013.01)

(58) Field of Classification Search
CPC ............ H01L 27/14605; H01L 27/148; H01L 27/14621; H01L 27/14609; H01L 27/14612
See application file for complete search history.

(56) References Cited

U.S. PATENT DOCUMENTS

| 9,270,915 | B2 | 2/2016 | Kido et al. | |
| 2008/0024529 | A1* | 1/2008 | Asano | G09G 3/3233 345/697 |
| 2011/0019043 | A1* | 1/2011 | Hamada | H04N 5/3696 348/294 |

* cited by examiner

*Primary Examiner* — Joseph C. Nicely
*Assistant Examiner* — Pavel G Ivanov
(74) *Attorney, Agent, or Firm* — IP & T Group LLP

(57) ABSTRACT

An image sensor may include a pixel array. The pixel array may include a plurality of sub pixel arrays arranged two-dimensionally. Each of the plurality of sub pixel arrays may include a first pixel block and a second pixel block adjacent to the first pixel block in a row direction. Each of the first and second pixel blocks may include a light reception unit including first to fourth unit pixels arranged in a 2×2 matrix structure and a driving circuit. The driving circuit of the first pixel block may be positioned at an upper side of the light reception unit of the first pixel block, and the driving circuit of the second pixel block may be positioned at a lower side of the light reception unit of the first pixel block. The upper side of the first pixel block and an upper side of the second pixel block may be aligned with each other in the row direction, and a lower side of the first pixel block and the lower side of the second pixel block may be aligned with each other in the row direction.

20 Claims, 9 Drawing Sheets

IMAGE SENSOR WITH REDUCED FIXED PATTERN NOISE

CROSS-REFERENCE TO RELATED APPLICATION

This application claims priority under 35 U.S.C. § 119 to Korean Patent Application No. 10-2016-0148090 filed on Nov. 8, 2016 in the Korean Intellectual Property Office, the disclosure of which is incorporated herein by reference in its entirety.

TECHNICAL FIELD

Various embodiments generally relate to a semiconductor device fabrication technology, and more particularly, to an image sensor.

DISCUSSION OF THE RELATED ART

An image sensor converts an optical image into an electrical signal. Recently, due to developments in the computer and communication industries, a demand for an image sensor with improved performance has increased for various devices, such as digital cameras, camcorders, Personal Communication System (PCS), game machines, security cameras, medical micro-cameras, and robots.

SUMMARY

Various embodiments are directed to an image sensor with improved performance.

In an embodiment, an image sensor may include: a pixel array including a plurality of sub pixel arrays arranged two-dimensionally, wherein each of the plurality of sub pixel arrays includes a plurality of pixel blocks that are arranged in an M×N (where M and N are natural numbers) matrix structure, and an (M,N+1) pixel block has a planar configuration obtained by inverting a planar configuration of the (M,N) pixel block in an N direction, and wherein each of the plurality of pixel blocks may include: a light reception unit including a plurality of unit pixels which generate photocharges in response to incident light and are arranged in an m×n (where m and n are natural numbers) matrix structure to have a shared pixel structure; and a driving circuit suitable for outputting an image signal corresponding to the photocharges.

The driving circuit of the (M,N) pixel block may be positioned at a first side of the light reception unit of the (M,N) pixel block in the N direction, and the driving circuit of the (M,N+1) pixel block may be positioned at a second side of the light reception unit of the (M,N+1) pixel block in the N direction. The light reception unit of the (M,N) pixel block may be aligned with the light reception unit of the (M,N+1) pixel block in an M direction.

In each of the plurality of sub pixel arrays, an (M+1,N) pixel block among the plurality of pixel blocks may have a planar configuration that is obtained by inverting the planar configuration of the (M,N) pixel block in the M direction, and an (M+1,N+1) pixel block among the plurality of pixel blocks may have a planar configuration that is obtained by inverting the planar configuration of the (M+1,N) pixel block in the N direction. The driving circuit of the (M,N) pixel block and the driving circuit of the (M+1,N) pixel block may be positioned at a first sides of the light reception unit of the (M,N) pixel block and the light reception unit of the (M+1,N) pixel block in the N direction, respectively. The driving circuit of the (M,N+1) pixel block and the driving circuit of the (M+1,N+1) pixel block may be positioned at a second sides opposite to the first sides of the light reception unit of the (M,N+1) pixel block and the light reception unit of the (M+1,N+1) pixel block in the N direction, respectively. The light reception unit of the (M,N) pixel block may be aligned with the light reception unit of the (M,N+1) pixel block in the M direction, and wherein the light reception unit of the (M+1,N) pixel block may be aligned with the light reception unit of the (M+1,N+1) pixel block in the M direction. The driving circuit of the (M,N+1) pixel block may be aligned with the driving circuit of the (M+1,N) pixel block in the M direction.

Furthermore, the image sensor may further include: a color filter array corresponding to the pixel array, wherein the color filter array comprises a plurality of color patterns which are arranged repeatedly to correspond to the plurality of pixel blocks, respectively, and wherein each of the plurality of color patterns includes a plurality of color filters corresponding to the plurality of unit pixels, respectively. When colors of color filters respectively corresponding to any one unit pixel as a first unit pixel among the plurality of unit pixels in the (M,N) pixel block and any one unit pixel as a second unit pixel among the plurality of unit pixels in the (M,N+1) pixel block may be the same, a distance between the first unit pixel and the driving circuit of the (M,N) pixel block may be different from a distance between the second unit pixel and the driving circuit of the (M,N+1) pixel block.

In an embodiment, an image sensor may include: a pixel array including a plurality of pixel blocks arranged in a matrix structure, wherein, among the plurality of pixel blocks, when compared to any one pixel block as a first pixel block, any one pixel block as a second pixel block adjacent to the first pixel block in a row direction has a planar configuration that is up-down symmetrical to the first pixel block, and wherein each of the plurality of pixel blocks includes: a light reception unit including a first unit pixel to a fourth unit pixel which generate photocharges in response to incident light and are arranged in a 2×2 matrix structure to have a shared pixel structure; and a driving circuit suitable for outputting an image signal corresponding to the photocharges.

The driving circuit of the first pixel block may be positioned at an upper side of the light reception unit of the first pixel block, and wherein the driving circuit of the second pixel block may be positioned at a lower side of the light reception unit of the second pixel block. The light reception unit of the first pixel block and the light reception unit of the second pixel block may be aligned in a left to right direction.

Furthermore, the image sensor may further include: a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters corresponding to the first unit pixel to the fourth unit pixel, respectively. In each of the plurality of pixel blocks, the first unit pixel is positioned at a shortest distance from the driving circuit and the fourth unit pixel is positioned at a longest distance from the driving circuit, the first unit pixel, the second unit pixel, the third unit pixel and the fourth unit pixel in the first pixel block may be positioned at a left upper part, a right upper part, a left lower part and a right lower part, respectively, and the first unit pixel, the second unit pixel, the third unit pixel and the fourth unit pixel in the second pixel block may be positioned at a left lower part, a right lower part, a left upper part and a right upper part, respectively. Color filters corresponding to unit pixels of the same position in the first pixel block and the second pixel block, respectively, may be the same in color. Colors of color filters respectively corresponding to the first unit pixel of the first pixel block and the third unit pixel of the second pixel block may be the same, wherein colors of color filters respectively corresponding to the second unit pixel of the first pixel block and the fourth unit pixel of the second pixel block may be the same, wherein colors of color filters respectively corresponding to the third unit pixel of the first pixel block and the first unit pixel of the second pixel block may be the same, and wherein colors of color filters respectively corresponding to the fourth unit pixel of the first pixel block and the second unit pixel of the second pixel block may be the same.

In an embodiment, an image sensor may include: a pixel array including a plurality of pixel blocks arranged in a matrix structure, wherein, among the plurality of pixel blocks, when compared to any one pixel block as a first pixel block, any one pixel block as a second pixel block adjacent to the first pixel block in a row direction has a planar configuration that is up-down symmetrical to the first pixel block, any one pixel block as a third pixel block adjacent to the first pixel block in a column direction has a planar configuration that is left-right symmetrical to the first pixel block, and any one pixel block as a fourth pixel block adjacent to the second pixel block and the third pixel block in the column direction and the row direction, respectively, has a planar configuration that is up-down symmetrical to the third pixel block, and wherein each of the plurality of pixel blocks includes: a light reception unit including a first unit pixel to a fourth unit pixel which generate photocharges in response to incident light and are arranged in a 2×2 matrix structure to have a shared pixel structure; and a driving circuit suitable for outputting an image signal corresponding to the photocharges.

The driving circuit of the first pixel block and the driving circuit of the third pixel block may be positioned at upper sides of the light reception unit of the first pixel block and the light reception unit of the third pixel block, respectively, and wherein the driving circuit of the second pixel block and the driving circuit of the fourth pixel block may be positioned at lower sides of the light reception unit of the second pixel block and the light reception unit of the fourth pixel block, respectively. The light reception unit of the first pixel block and the light reception unit of the second pixel block may be aligned in a left to right direction, and the light reception unit of the third pixel block and the light reception unit of the fourth pixel block may be aligned in a left to right direction. The driving circuit of the second pixel block and the driving circuit of the third pixel block may be aligned in a left to right direction.

Furthermore, the image sensor may further include: a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters corresponding to the first unit pixel to the fourth unit pixel, respectively. In each of the plurality of pixel blocks, the first unit pixel is positioned at a shortest distance from the driving circuit and the fourth unit pixel is positioned at a longest distance from the driving circuit, the first unit pixel, the second unit pixel, the third unit pixel and the fourth unit pixel in the first pixel block may be positioned at a left upper part, a right upper part, a left lower part and a right lower part, respectively; the first unit pixel, the second unit pixel, the third unit pixel and the fourth unit pixel in the second pixel block may be positioned at a left lower part, a right lower part, a left upper part and a right upper part, respectively; the first unit pixel, the second unit pixel, the third unit pixel and the fourth unit pixel in the third pixel block may be positioned at a right upper part, a left upper part, a right lower part and a left lower part, respectively; and the first unit pixel, the second unit pixel, the third unit pixel and the fourth unit pixel in the fourth pixel block may be positioned at a right lower part, a left lower part, a right upper part and a left upper part, respectively. Color filters corresponding to unit pixels of the same position in the first pixel block to the fourth pixel block, respectively, may be the same in color. Colors of color filters respectively corresponding to the first unit pixel of the first pixel block, the third unit pixel of the second pixel block, the second unit pixel of the third pixel block and the fourth unit pixel of the fourth pixel block may be the same, wherein colors of color filters respectively corresponding to the second unit pixel of the first pixel block, the fourth unit pixel of the second pixel block, the first unit pixel of the third pixel block and the third unit pixel of the fourth pixel block may be the same, wherein colors of color filters respectively corresponding to the third unit pixel of the first pixel block, the first unit pixel of the second pixel block, the fourth unit pixel of the third pixel block and the second unit pixel of the fourth pixel block may be the same, and wherein colors of color filters respectively corresponding to the fourth unit pixel of the first pixel block, the second unit pixel of the second pixel block, the third unit pixel of the third pixel block and the first unit pixel of the fourth pixel block may be the same.

DETAILED DESCRIPTION

Figure 1:
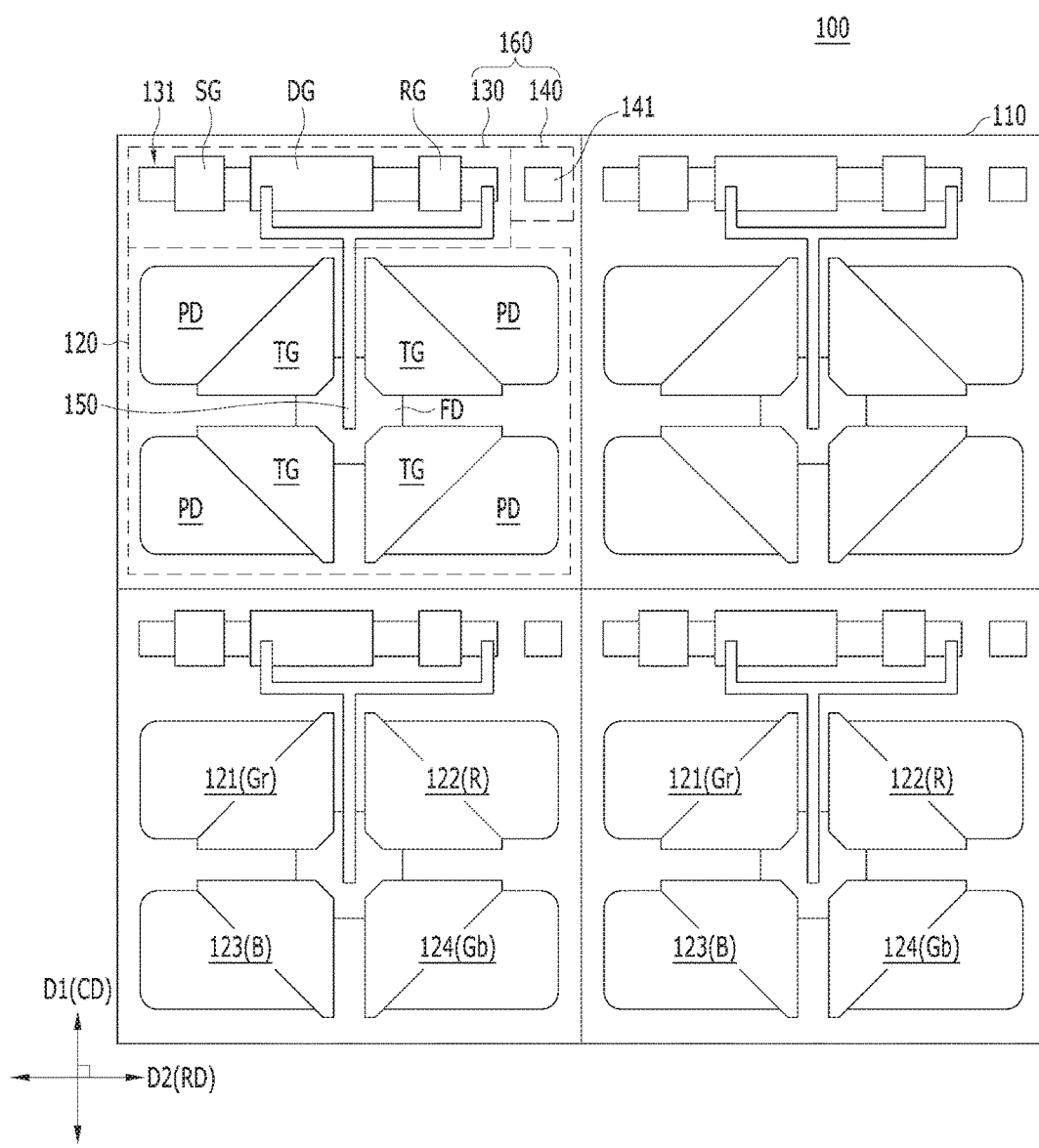
FIG. 1 is a plan view illustrating a portion of a pixel array of an image sensor according to a comparative example of the present disclosure.

Various embodiments will be described below in more detail with reference to the accompanying drawings. The drawings may not be necessarily to scale and in some instances, proportions of at least some structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or Illustrated example of a multi-layer structure may not reflect all layers present in that particular multilayer structure (e.g., one or more additional layers may be present between two Illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following embodiments are to provide an image sensor with improved performance. For example, the image sensor may provide a high-resolution image. The image sensor according to an embodiment may have a shared pixel structure. According to an embodiment of the present disclosure an image sensor is provided having a shared pixel structure that is capable of minimizing or completely preventing differences in the image signals outputted from the unit pixels and providing an improved high-resolution image. For reference, the difference in the image signals is due to the offset, e.g., fixed pattern noise FPN.

Hereinafter, the reason why a difference may occur in the image signals outputted from the unit pixels of a shared pixel structure of an image sensor will be described in detail with reference to FIGS. 1 and 2.

Figure 2:
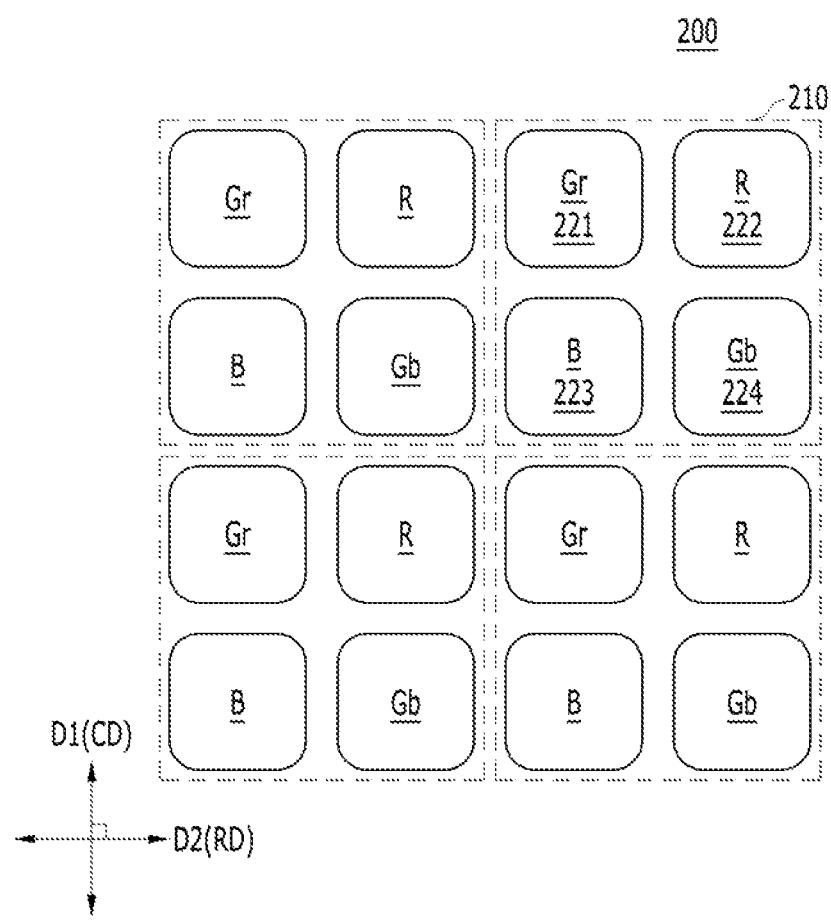
FIG. 2 is a plan view illustrating a portion of a color filter array corresponding to the portion of the pixel array of the image sensor according to the comparative example shown in FIG. 1.

FIG. 1 is a plan view illustrating a portion of a pixel array of an image sensor according to a comparative example of the present disclosure, and FIG. 2 is a plan view Illustrating a portion of a color filter array corresponding to the portion of the pixel array of the image sensor according to the comparative example shown in FIG. 1.

Referring to FIG. 1, the image sensor according to the comparative example may include a pixel array 100 in which a plurality of pixel blocks 110 are arranged two-dimensionally. The plurality of pixel blocks 110 may be arranged to have the same planar shape in both a first direction D1 and a second direction D2. Each of the plurality of the pixel blocks 110 may include a plurality of unit pixels 121 to 124 which are arranged in an m×n (where m and n are natural numbers) matrix structure and have a shared pixel structure. Hereafter, in this comparative example, descriptions will be made by exemplifying the case where each of the plurality of pixel blocks 110 has a 4-shared pixel structure which includes 4 unit pixels 121 to 124 arranged in a 2×2 matrix structure.

Each of the plurality of pixel blocks 110 may include a light reception unit 120, a conductive line 150 and a driving circuit 160. The light reception unit 120 may include the plurality of unit pixels 121 to 124 having the shared pixel structure and generate photocharges in response to incident light. The driving circuit 160 may output an image signal corresponding to the photocharges generated by the light reception unit 120. The conductive line 150 may electrically couple the light reception unit 120 and the driving circuit 160. The driving circuit 160 may include an output unit 130 which includes a plurality of pixel transistors, and a pickup unit 140 which controls ground potential. While not shown in the drawing, the light reception unit 120, the output unit 130 and the pickup unit 140 may be isolated by an isolation structure.

The light reception unit 120 may include the plurality of unit pixels 121 to 124 which share a floating diffusion FD. For example, the light reception unit 120 may include a first unit pixel 121 to a fourth unit pixel 124 which are disposed to surround the floating diffusion FD. The floating diffusion FD may be positioned at a center in the light reception unit 120, the first unit pixel 121 may be disposed at a shortest distance from the driving circuit 160, and the fourth unit pixel 124 may be disposed at a longest distance from the driving circuit 160. The output unit 130 in the driving circuit 160 may serve as a reference for the distances between the first unit pixel 121 to the fourth unit pixel 124 and the driving circuit 160. Thus, in the light reception unit 120, the first unit pixel 121, the second unit pixel 122, the third unit pixel 123 and the fourth unit pixel 124 may be positioned at a left upper part, a right upper part, a left lower part and a right lower part, respectively. Each of the first unit pixel 121 to the fourth unit pixel 124 may include a photoelectric conversion element PD which generates photocharges in response to incident light and a transfer transistor which transfers the photocharges generated in the photoelectric conversion element PD, to the floating diffusion FD in response to a transfer signal. The transfer signal may be applied to a transfer gate TG, and the photoelectric conversion element PD and the floating diffusion FD may serve as the source and the drain of the transfer transistor, respectively.

The output unit 130 may generate an image signal corresponding to the photocharges generated by the light reception unit 120, and output the image signal to a column line (not shown) in response to a select signal applied through a row line (not shown). The output unit 130 may include a reset transistor, a driver transistor and a selection transistor. The reset transistor, the driver transistor and the selection transistor may share one active region 131, and include a reset gate RG, a driver gate DG and a selection gate SG, respectively. The driver gate DG may be positioned at the center of the active region 131, and the reset gate RG and the selection gate SG may be positioned at one side and the other side of the driver gate DG along the second direction D2, respectively. Junction regions (that is, sources and drains) may be formed in the active region 131 at both sides of the reset gate RG, the driver gate DG and the selection gate SG. The conductive line 150 may be coupled to the junction region (for example, source) at one side of the reset gate RG and to the driver gate DG, and the column line may be coupled to the junction region at the other side of the selection gate SG. A power supply voltage (VDD) may be applied to the junction region between the driver gate DG and the reset gate RG. The row line may be coupled to the selection gate SG. The output unit 130 may be positioned at one side of the light reception unit 120 in the first direction D1. The first direction D1 and the second direction D2 may be a column direction CD and a row direction RD, respectively.

The conductive line 150 may electrically couple the floating diffusion FD of the light reception unit 120 with the driver gate DG and the source of the reset transistor of the output unit 130.

The pickup unit 140 may control the ground potential of the light reception unit 120 and the output unit 130, and may include a pickup region 141. The pickup region 141 may include an impurity region which is formed in a substrate, and a predetermined bias may be applied to the substrate formed with the light reception unit 120 and the output unit 130, through the pickup region 141. Similarly to the output unit 130, the pickup unit 140 may be positioned at one side of the light reception unit 120 in the first direction D1, side by side with the output unit 130. That is to say, the pickup unit 140 may be positioned on the same line with the output unit 130 in the second direction D2.

Referring to FIG. 2, the image sensor according to the comparative example may include a color filter array 200 corresponding to the pixel array 100. The color filter array 200 may include a plurality of color patterns 210 which are arranged repeatedly to correspond to the plurality of pixel blocks 110, respectively. Each of the plurality of color patterns 210 may include a plurality of color filters 221 to 224 corresponding to the plurality of unit pixels 121 to 124, respectively. For example, each of the plurality of color patterns 210 may include a first color filter 221 to a fourth color filter 224 corresponding to the first unit pixel 121 to the fourth unit pixel 124, respectively. For example, each of the plurality of color patterns 210 may be a Bayer pattern in which RGr/BGb are repeated. In other words, the first color filter 221, the second color filter 222, the third color filter 223 and the fourth color filter 224 may be a first green filter Gr, a red filter R, a blue filter B and a second green filter Gb, respectively.

In the above-described image sensor according to the comparative example, it may be seen that, because each of the plurality of pixel blocks 110 has the shared pixel structure, all the planar shapes of the first unit pixel 121 to the fourth unit pixel 124 including adjacent structures in the pixel block 110 are different. In detail, the first unit pixel 121 which is positioned at the left upper part in the pixel block 110 may have a planar shape in which the photoelectric conversion element PD and the transfer gate TG are disposed adjacent to the selection gate SG, the driver gate DG and the conductive line 150. The second unit pixel 122 which is positioned at the right upper part in the pixel block 110 may have a planar shape in which the photoelectric conversion element PD and the transfer gate TG are disposed adjacent to the reset gate RG, the pickup region 141 and the conductive line 150. The third unit pixel 123 which is positioned at the left lower part in the pixel block 110 may have a planar shape that is adjacent to the first unit pixel 121 and has a longest distance from the pickup region 141 in the pixel block 110. The fourth unit pixel 124 which is positioned at the right lower part in the pixel block 110 may have a planar shape that is adjacent to the second unit pixel 122 and has a longest distance from the selection gate SG in the pixel block 110. Expressed otherwise, it may be seen that, in the pixel block 110, all the distances between the driving circuit 160, that is, the output unit 130 or the pickup unit 140, and the first unit pixel 121 to the fourth unit pixel 124 are different. In this way, because the planar shapes of the first unit pixel 121 to the fourth unit pixel 124 including the adjacent structures in the pixel block 110 or the distances between the first unit pixel 121 to the fourth unit pixel 124 and the driving circuit 160 are all different, even though the amounts of the photocharges generated in the first unit pixel 121 to the fourth unit pixel 124 in response to incident light are all the same, signals outputted through the output unit 130 cannot help but be all different. Moreover, differences may be caused in the image signals outputted by respective unit pixels, due to the interference, for example, parasitic capacitance, induced between adjacent structures.

Moreover, because the plurality of color patterns 210 are disposed to correspond to the plurality of pixel blocks 110, respectively, the differences in the image signals become substantial. This is because an image signal corresponding to the incident light discolored by the first color filter 221 is outputted from only the first unit pixel 121 and is not outputted from the other unit pixels, that is, the second unit pixel 122 to the fourth unit pixel 124, in each of the plurality of pixel blocks 110. That is to say, because the image signal corresponding to the incident light discolored by the first color filter 221 is not outputted from the second unit pixel 122 to the fourth unit pixel 124 which have different planar shapes from the first unit pixel 121, the differences in the image signals outputted from the respective unit pixels cannot help but become serious.

In the following embodiments of the present disclosure, detailed descriptions will be made for an image sensor capable of preventing differences from being caused in the image signals outputted from respective unit pixels when a shared pixel structure is adopted as described above in the comparative example.

Figure 3:
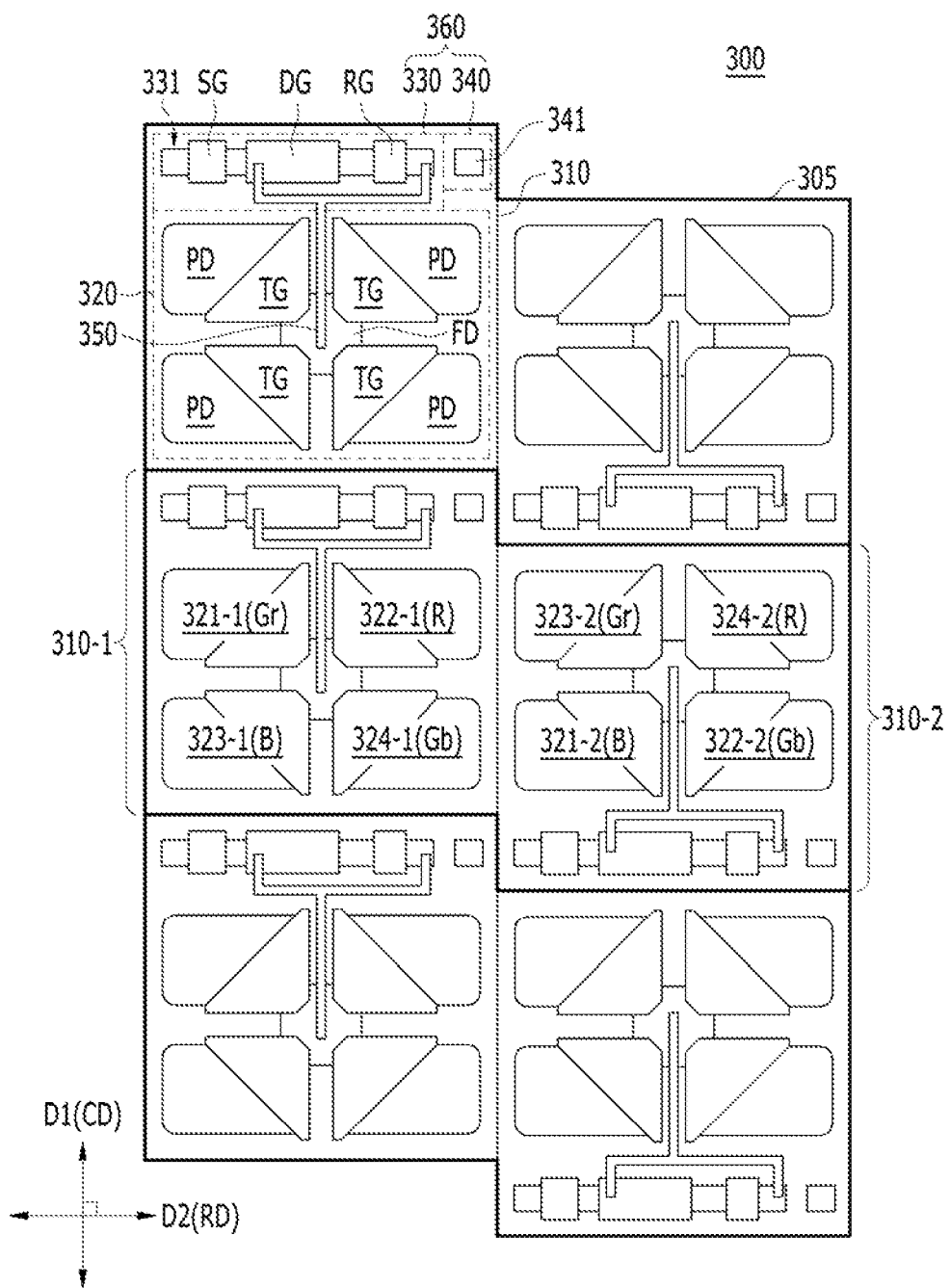
FIG. 3 is a plan view illustrating a portion of a pixel array of an image sensor in accordance with a first embodiment of the present invention.
Figure 4:
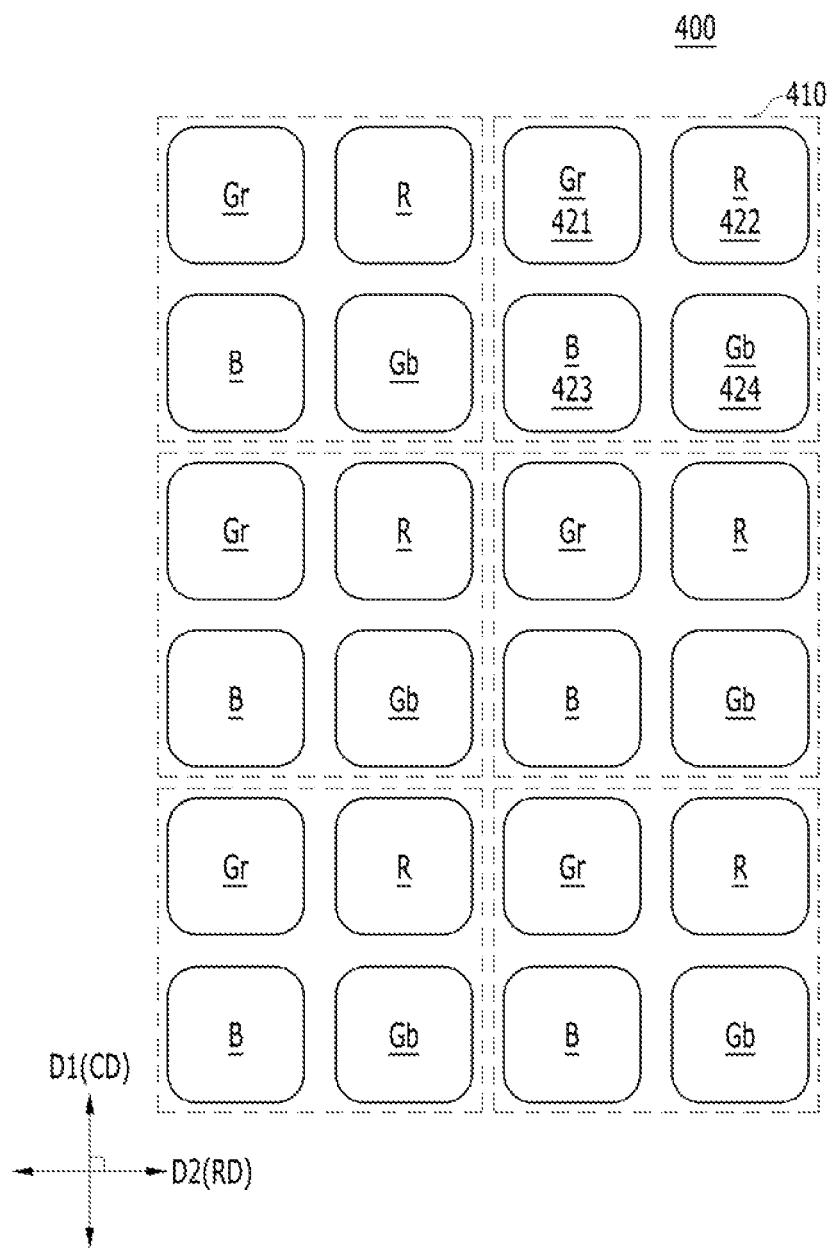
FIG. 4 is a plan view illustrating a portion of a color filter array corresponding to the portion of the pixel array of the image sensor in accordance with the first embodiment of the present invention.

FIG. 3 is a plan view illustrating a portion of a pixel array of an image sensor in accordance with a first embodiment, and FIG. 4 is a plan view illustrating a portion of a color filter array corresponding to the portion of the pixel array of the image sensor in accordance with the first embodiment of the present invention.

Referring to FIG. 3, the image sensor in accordance with the first embodiment may include a pixel array 300 in which a plurality of sub pixel arrays 305 are arranged two-dimensionally. Each of the plurality of sub pixel arrays 305 may include a plurality of pixel blocks 310 which are arranged in an M×N (where M and N are natural numbers) matrix structure. In other words, the pixel array 300 may include a plurality of pixel blocks 310 which are arranged in an M direction and an N direction. The M direction and the N direction may be a row direction RD and a column direction CD, respectively. Each of the plurality of pixel blocks 310 may include a plurality of unit pixels which are arranged in an m×n (where m and n are natural numbers) matrix structure and have a shared pixel structure. For example, in the first embodiment, each of the plurality of sub pixel arrays 305 may include a (1,1) first pixel block 310-1 and a (1,2) second pixel block 310-2 which are arranged in a 1×2 matrix structure. Similarly to the comparative example, each of the plurality of pixel blocks 310 may have a 4-shared pixel structure which includes 4 unit pixels arranged in a 2×2 matrix structure. This is for the sake of convenience in explanation, and it is to be noted that the image sensor in accordance with the first embodiment may have a $2^n$ (where n is a natural number)-shared pixel structure.

Each of the plurality of pixel blocks 310 may include a light reception unit 320, a conductive line 350 and a driving circuit 360. The light reception unit 320 may include a plurality of unit pixels having the shared pixel structure and generate photocharges in response to incident light. The driving circuit 360 may output an image signal corresponding to the photocharges generated by the light reception unit 320. The conductive line 350 may electrically couple the light reception unit 320 and the driving circuit 360. The driving circuit 360 may include an output unit 330 which includes a plurality of pixel transistors, and a pickup unit 340 which controls ground potential. While not shown in the drawing, the light reception unit 320, the output unit 330 and the pickup unit 340 may be isolated by an isolation structure.

The light reception unit 320 may include the plurality of unit pixels which share a floating diffusion FD. For example, the light reception unit 320 may include a first unit pixel 321-1 (or 321-2) to a fourth unit pixel 324-1 (or 324-2) which are disposed to surround the floating diffusion FD. The floating diffusion FD may be positioned at a center in the light reception unit 320. Each of the first unit pixel 321-1 (or 321-2) to the fourth unit pixel 324-1 (or 324-2) may include a photoelectric conversion element PD which generates photocharges in response to incident light and a transfer transistor which transfers the photocharges generated in the photoelectric conversion element PD, to the floating diffusion FD in response to a transfer signal. The transfer signal may be applied to a transfer gate TG, and the photoelectric conversion element PD and the floating diffusion FD may serve as the source and the drain, respectively, of the transfer transistor.

The output unit 330 may generate an image signal corresponding to the photocharges generated by the light reception unit 320, and output the image signal to a column line (not shown) in response to a select signal applied through a row line (not shown). The output unit 330 may include a reset transistor, a driver transistor and a selection transistor. The reset transistor, the driver transistor and the selection transistor may share one active region 331, and include a reset gate RG, a driver gate DG and a selection gate SG, respectively. The driver gate DG may be positioned at the center of the active region 331, and the reset gate RG and the selection gate SG may be positioned at one side and the other side of the driver gate DG in a second direction D2, respectively. Junction regions (that is, sources and drains) may be formed in the active region 331 at both sides of the reset gate RG, the driver gate DG and the selection gate SG. The conductive line 350 may be coupled to the junction region (for example, source) at one side of the reset gate RG and to the driver gate DG, and the column line may be coupled to the junction region at the other side of the selection gate SG. A power supply voltage (VDD) may be applied to the junction region between the driver gate DG and the reset gate RG. The row line may be coupled to the selection gate SG. The output unit 330 may be positioned at one side of the light reception unit 320 in a first direction D1. The first direction D1 and the second direction D2 may be the column direction CD and the row direction RD, respectively.

The conductive line 350 may electrically couple the floating diffusion FD of the light reception unit 320 with the driver gate DG and the source of the reset transistor of the output unit 330.

The pickup unit 340 may control the base potential of the light reception unit 320 and the output unit 330, and may include a pickup region 341. The pickup region 341 may include an impurity region which is formed in a substrate. A predetermined bias, for example, a ground voltage (VSS), may be applied to the substrate formed with the light reception unit 320 and the output unit 330, through the pickup region 341. Similarly to the output unit 330, the pickup unit 340 may be positioned at one side of the light reception unit 320 in the first direction D1, side by side with the output unit 330. That is to say, the pickup unit 340 may be positioned on the same line with the output unit 330 in the second direction D2.

Referring to FIG. 4, the image sensor in accordance with the first embodiment may include a color filter array 400 corresponding to the pixel array 300. The color filter array 400 may include a plurality of color patterns 410 which are arranged repeatedly to correspond to the plurality of pixel blocks 310, respectively. Each of the plurality of color patterns 410 may include a plurality of color filters 421 to 424 corresponding to a plurality of unit pixels, respectively. Each of the plurality of color filters 421 to 424 may be a single filter including any one or a multi-filter including at least two, selected from the group consisting of a red filter, a green filter, a blue filter, a cyan filter, a yellow filter, a magenta filter, a white filter, a black filter, an IR cutoff filter, an IR pass filter and a band pass filter which passes a specific wavelength band. For example, each of the plurality of color patterns 410 may include a first color filter 421 to a fourth color filter 424 which are arranged in a 2×2 matrix structure and correspond to a plurality of unit pixels, respectively. In each of the plurality of color patterns 410, the first color filter 421, the second color filter 422, the third color filter 423 and the fourth color filter 424 may be positioned at a left upper part, a right upper part, a left lower part and a right lower part, respectively, and may have the same layout shape over the entire color filter array 400. For example, each of the plurality of color patterns 410 may be a Bayer pattern in which RGr/BGb are repeated. In other words, the first color filter 421, the second color filter 422, the third color filter 423 and the fourth color filter 424 may be a first green filter Gr, a red filter R, a blue filter B and a second green filter Gb, respectively.

Meantime, while the first embodiment illustrates the case where each of the plurality of color patterns 410 is a Bayer pattern, it is to be noted that various other color patterns may be applied. For example, each of the plurality of color patterns 410 may be a WRGB pattern which includes a white filter W, a red filter R, a green filter G and a blue filter B.

Referring again to FIG. 3, in the image sensor in accordance with the first embodiment, in order to prevent differences from being caused in the image signals outputted from respective unit pixels as a shared pixel structure is adopted, the plurality of pixel blocks 310 in each sub pixel array 305 may have planar shapes that are symmetrical to each other.

In detail, each of the plurality of sub pixel arrays 305 may include the plurality of pixel blocks 310 which are arranged in the M×N (where M and N are natural numbers) matrix structure. Among the plurality of pixel blocks 310, when compared to an (M,N) pixel block 310, the planar shape of an (M,N+1) pixel block 310 may be one that is obtained by inverting the planar shape of the (M,N) pixel block 310 in the N direction. Namely, when compared to the planar shape of the (M,N) pixel block 310, the (M,N+1) pixel block 310 may have a planar shape that is symmetrical to the (M,N) pixel block 310 in the first direction D1. Therefore, when observing each of the plurality of sub pixel arrays 305, the driving circuit 360 of the (M,N) pixel block 310 may be positioned at one side of the light reception unit 320 of the (M,N) pixel block 310 in the N direction, and the driving circuit 360 of the (M,N+1) pixel block 310 may be positioned at the other side of the light reception unit 320 of the (M,N+1) pixel block 310 in the N direction. The light reception unit 320 of the (M,N) pixel block 310 and the light reception unit 320 of the (M,N+1) pixel block 310 may be aligned in the M direction. The N direction and the M direction may be the first direction D1 and the second direction D2, respectively, and the first direction D1 and the second direction D2 may be the column direction CD and the row direction RD, respectively.

For example, each of the plurality of sub pixel arrays 305 may include a (1,1) first pixel block 310-1 and a (1,2) second pixel block 310-2 which may be arranged in a 1×2 matrix structure. The planar shape of the second pixel block 310-2 may be one that is obtained by inverting the planar shape of the first pixel block 310-1 in the first direction D1. That is to say, when compared to the planar shape of the first pixel block 310-1, the second pixel block 310-2 may have a planar shape that is symmetrical to the first pixel block 310-1 in the first direction D1. The driving circuit 360 of the first pixel block 310-1 may be positioned at one side (or the upper side) of the light reception unit 320 of the first pixel block 310-1 in the first direction D1, while the driving circuit 360 of the second pixel block 310-2 may be positioned at the other side (or the lower side) of the light reception unit 320 of the second pixel block 310-2 in the first direction D1. In each of the driving circuits 360 of the first pixel block 310-1 and the second pixel block 310-2, the output unit 330 and the pickup unit 340 may be positioned at a left side and a right side, respectively. The light reception unit 320 of the first pixel block 310-1 and the light reception unit 320 of the second pixel block 310-2 may be aligned in the second direction D2. In other words, the light reception unit 320 of the first pixel block 310-1 and the light reception unit 320 of the second pixel block 310-2 may be aligned in the left to right direction.

In the image sensor in accordance with the first embodiment, in each of the plurality of sub pixel arrays 305, when the first unit pixels 321-1 and 321-2 are disposed at a shortest distance from the driving circuits 360, for example, the output unit 330, and the fourth unit pixels 324-1 and 324-2 are disposed at a longest distance from the driving circuits 360, the first pixel block 310-1 and the second pixel block 310-2 may have planar shapes that are symmetrical to each other in the first direction D1. Therefore, the layout of the plurality of unit pixels in the first pixel block 310-1 and the layout of the plurality of unit pixels in the second pixel block 310-2 may be different from each other. For example, in the first pixel block 310-1, the first unit pixel 321-1, the second unit pixel 322-1, the third unit pixel 323-1 and the fourth unit pixel 324-1 may be positioned at a left upper part, a right upper part, a left lower part and a right lower part, respectively. Conversely, in the second pixel block 310-2, the first unit pixel 321-2, the second unit pixel 322-2, the third unit pixel 323-2 and the fourth unit pixel 324-2 may be positioned at a left lower part, a right lower part, a left upper part and a right upper part, respectively. In this regard, while, in the comparative example, the positions of the first unit pixel 121 to the fourth unit pixel 124 are all the same in the plurality of respective pixel blocks 110, in the present first embodiment, it may be seen that the positions of the first unit pixel 321-1 to the fourth unit pixel 324-1 in the first pixel block 310-1 are all different from the positions of the first unit pixel 321-2 to the fourth unit pixel 324-2 in the second pixel block 310-2. Accordingly, the colors of color filters corresponding to unit pixels of the same position in the first pixel block 310-1 and the second pixel block 310-2 are the same. For example, the first color filter 421 of FIG. 4 may correspond to each of the first unit pixel 321-1 of the first pixel block 310-1 and the third unit pixel 323-2 of the second pixel block 310-2. The second color filter 422 of FIG. 4 may correspond to each of the second unit pixel 322-1 of the first pixel block 310-1 and the fourth unit pixel 324-2 of the second pixel block 310-2. The third color filter 423 of FIG. 4 may correspond to each of the third unit pixel 323-1 of the first pixel block 310-1 and the first unit pixel 321-2 of the second pixel block 310-2. The fourth color filter 424 of FIG. 4 may correspond to each of the fourth unit pixel 324-1 of the first pixel block 310-1 and the second unit pixel 322-2 of the second pixel block 310-2.

In this way, in the image sensor in accordance with the first embodiment, while all the positions of the first unit pixels 321-1 and 321-2 to the fourth unit pixels 324-1 and 324-2 in the respective pixel blocks 310 of each sub pixel array 305 are different, because color patterns 410 corresponding to the respective pixel blocks 310 retain a predetermined pattern, it is possible to prevent differences from being caused in the image signals outputted from the respective unit pixels, even though the shared pixel structure is adopted. In detail, in the sub pixel array 305, unit pixels corresponding to color filters of the same color, for example, the first unit pixel 321-1 in the first pixel block 310-1 and the third unit pixel 323-2 in the second pixel block 310-2 corresponding to first color filters 421 cannot help but have different planar shapes. Namely, the distance between the first unit pixel 321-1 and the output unit 330 in the first pixel block 310-1 and the distance between the third unit pixel 323-2 and the output unit 330 in the second pixel block 310-2 cannot help but be different from each other. Due to this fact, the image signals outputted by the first unit pixel 321-1 in the first pixel block 310-1 and the third unit pixel 323-2 in the second pixel block 310-2 cannot help but be different from each other. By merging the different image signals outputted from the unit pixels of the first pixel block 310-1 and the second pixel block 310-2 by the unit of at least one sub pixel array 305, it is possible to prevent differences from being caused in the image signals outputted from the respective unit pixels.

For reference, in the comparative example, an image signal corresponding to incident light discolored by any one color filter is outputted from only any one unit pixel having the same planar shape in each of the plurality of pixel blocks 110. However, in the image sensor in accordance with the first embodiment, since an image signal is outputted from a plurality of unit pixels which have different planar shapes, it is possible to prevent differences from being caused in the image signals outputted from the respective unit pixels.

Figure 5:
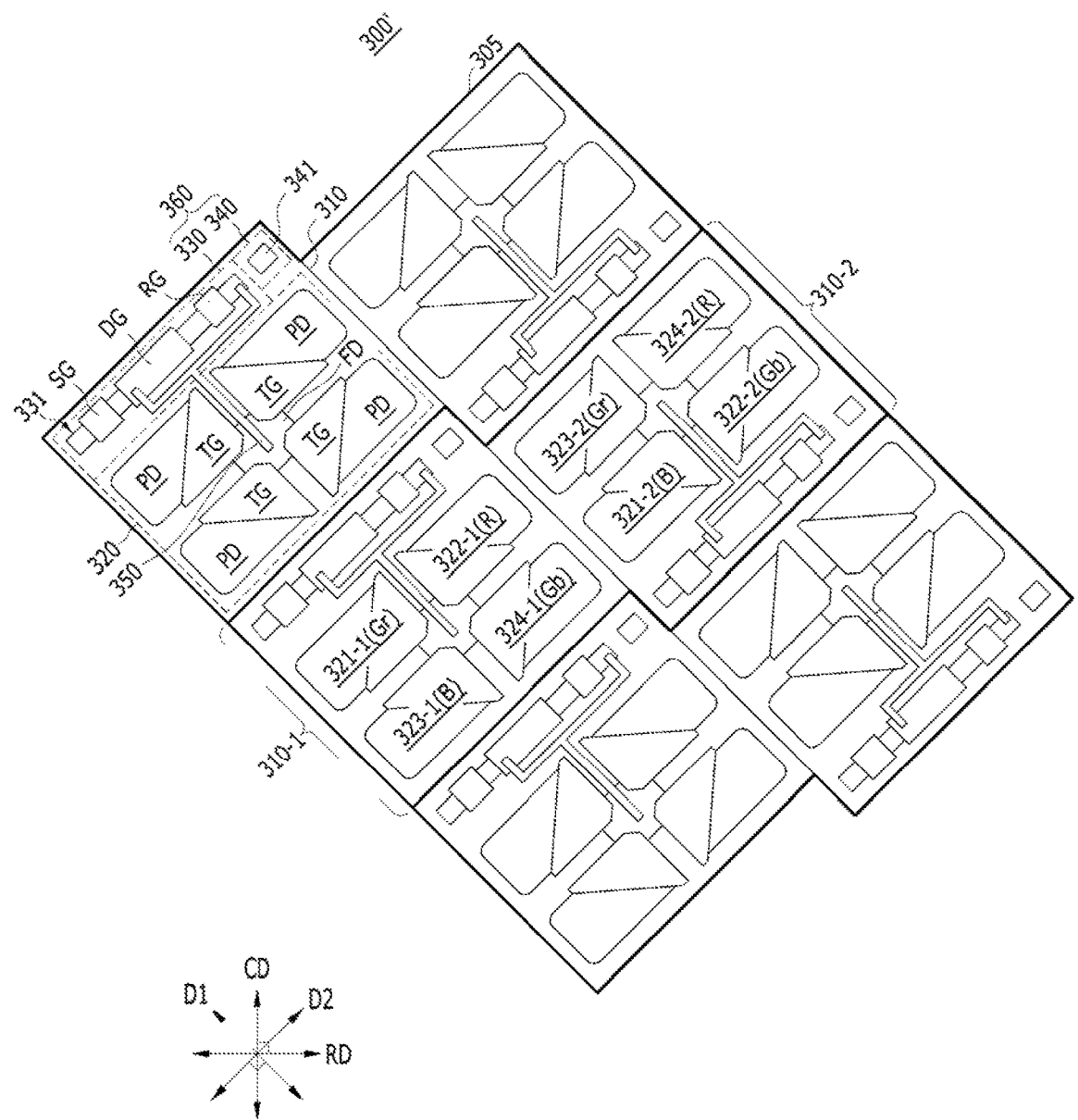
FIG. 5 is a plan view illustrating a portion of a pixel array of an image sensor in accordance with a variation of the first embodiment of the present invention.

FIG. 5 is a plan view illustrating a portion of a pixel array of an image sensor in accordance with a variation of the first embodiment of the present invention. For the sake of convenience in explanation, the same reference symbols as the first embodiment will be used herein.

Referring to FIG. 5, the image sensor in accordance with the variation of the first embodiment may include a pixel array 300' in which a plurality of sub pixel arrays 305 are arranged two-dimensionally. Each of the plurality of sub pixel arrays 305 may include a plurality of pixel blocks 310 which are arranged in an M×N (where M and N are natural numbers) matrix structure. That is to say, the pixel array 300' may include a plurality of pixel blocks 310 which are arranged in a first direction D1 and a second direction D2. The first direction D1 and the second direction D2 may be oblique directions that cross with each other and have slopes with respect to a row direction RD or a column direction CD. The pixel array 300' is to easily secure the layout and interval of wiring lines which extend in the row direction RD and the column direction CD.

In summary, while, in the first embodiment, the plurality of pixel blocks 310 in the sub pixel array 305 have planar shapes that are symmetrical in the column direction CD, in this variation of the first embodiment, the plurality of pixel blocks 310 in the sub pixel array 305 may have planar shapes that are symmetrical in the first direction D1 which is an oblique direction relative to the column direction CD.

Figure 6:
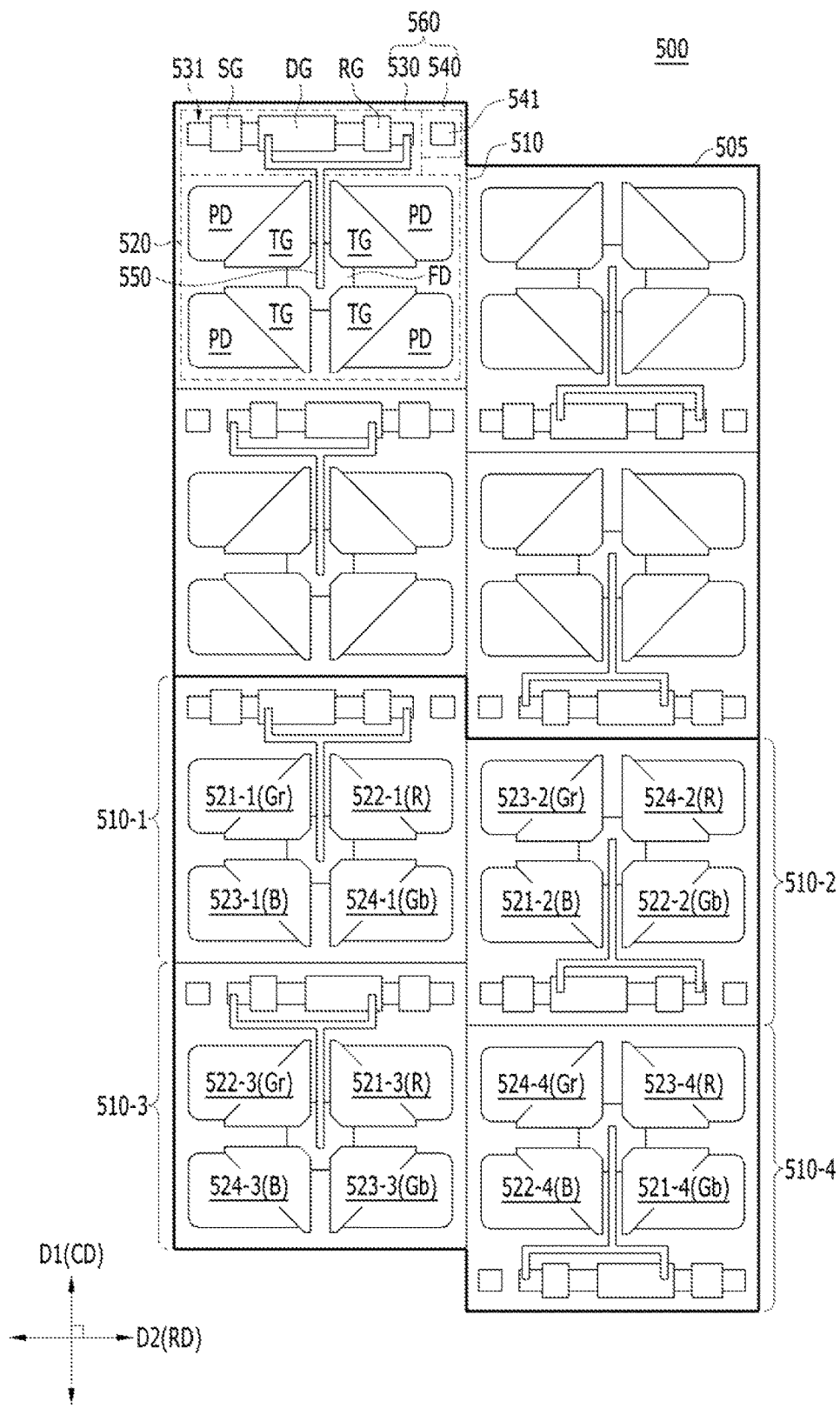
FIG. 6 is a plan view illustrating a portion of a pixel array of an image sensor in accordance with a second embodiment of the present invention.
Figure 7:
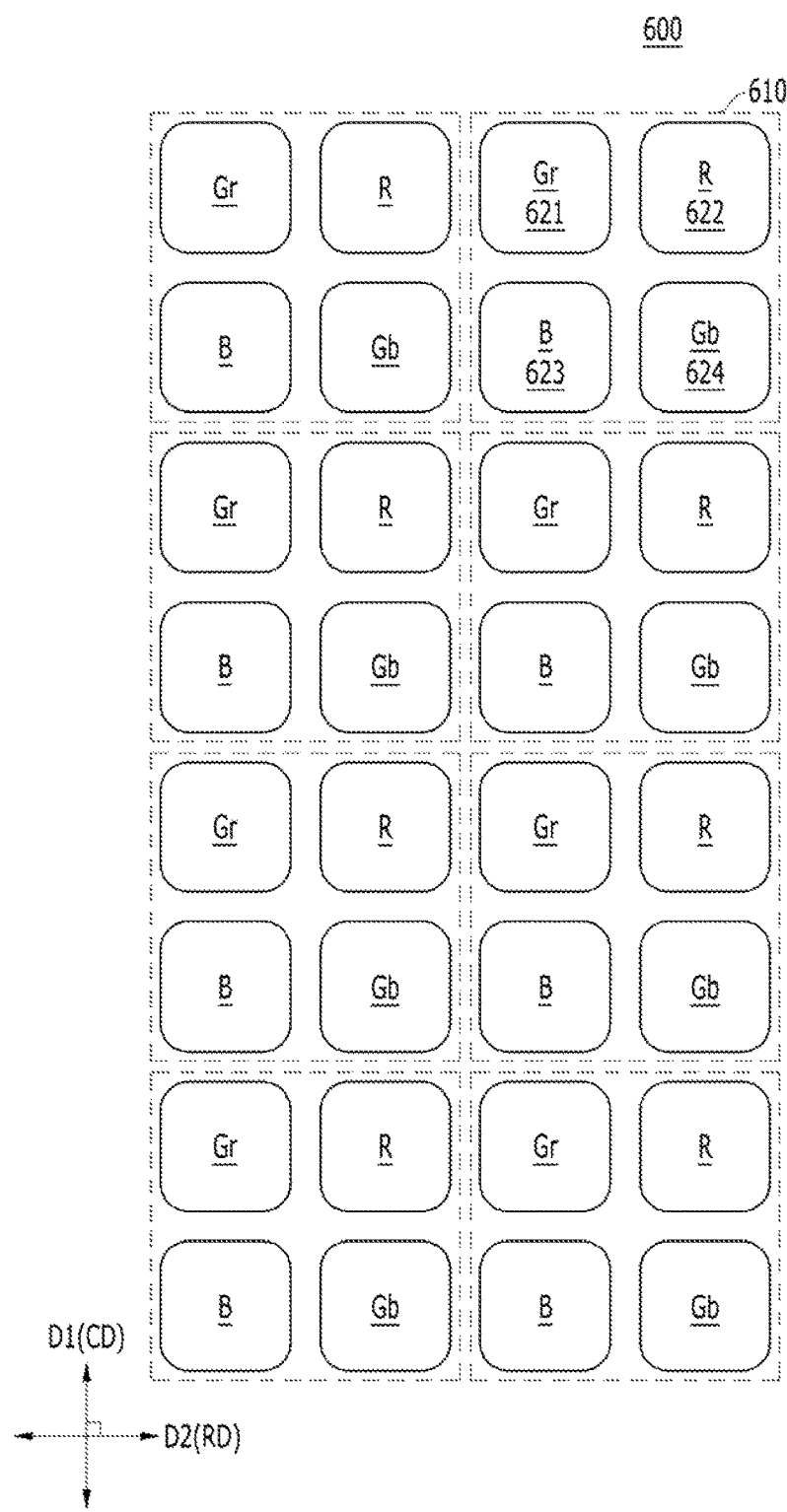
FIG. 7 is a plan view illustrating a portion of a color filter array corresponding to the portion of the pixel array of the image sensor in accordance with the second embodiment of the present invention.

FIG. 6 is a plan view illustrating a portion of a pixel array of an image sensor in accordance with a second embodiment, and FIG. 7 is a plan view illustrating a portion of a color filter array corresponding to the portion of the pixel array of the image sensor in accordance with the second embodiment of the present invention.

Referring to FIG. 6, the image sensor in accordance with the second embodiment may include a pixel array 500 in which a plurality of sub pixel arrays 505 are arranged two-dimensionally. Each of the plurality of sub pixel arrays 505 may include a plurality of pixel blocks 510 which are arranged in an M×N (where M and N are natural numbers) matrix structure. In other words, the pixel array 500 may include a plurality of pixel blocks 510 which are arranged in an M direction and an N direction. The M direction and the N direction may be a row direction RD and a column direction CD, respectively. Each of the plurality of pixel blocks 510 may include a plurality of unit pixels which are arranged in an m×n (where m and n are natural numbers) matrix structure and have a shared pixel structure. For example, in the second embodiment, each of the plurality of sub pixel arrays 505 may include a first pixel block 510-1 to a fourth pixel block 510-4 which are arranged in a 2×2 matrix structure. Similarly to the comparative example, each of the plurality of pixel blocks 510 may have a 4-shared pixel structure which includes 4 unit pixels arranged in a 2×2 matrix structure, as an example. It is to be noted that the image sensor in accordance with the second embodiment may have a $2^n$ (where n is a natural number)-shared pixel structure.

Each of the plurality of pixel blocks 510 may include a light reception unit 520, a conductive line 550 and a driving circuit 560. The light reception unit 520 may include a plurality of unit pixels having the shared pixel structure and generate photocharges in response to incident light. The driving circuit 560 may output an image signal corresponding to the photocharges generated by the light reception unit 520. The conductive line 550 may electrically couple the light reception unit 520 and the driving circuit 560. The driving circuit 560 may include an output unit 530 which includes a plurality of pixel transistors, and a pickup unit 540 which controls ground potential. While not shown in the drawing, the light reception unit 520, the output unit 530 and the pickup unit 540 may be isolated by an isolation structure.

The light reception unit 520 may include the plurality of unit pixels which share a floating diffusion FD. For example, the light reception unit 520 may include a first unit pixel 521-1 (or 521-2, 521-3, 521-4) to a fourth unit pixel 524-1 (or 524-2, 524-3, 524-4) which are disposed to surround the floating diffusion FD. The floating diffusion FD may be positioned at a center in the light reception unit 520. Each of the first unit pixel 521-1 (or 521-2, 521-3, 521-4) to the fourth unit pixel 524-1 (or 524-2, 524-3, 524-4) may include a photoelectric conversion element PD which generates photocharges in response to incident light and a transfer transistor which transfers the photocharges generated in the photoelectric conversion element PD, to the floating diffusion FD in response to a transfer signal. The transfer signal may be applied to a transfer gate TG, and the photoelectric conversion element PD and the floating diffusion FD may serve as the source and the drain of the transfer transistor, respectively.

The output unit 530 may generate an image signal corresponding to the photocharges generated by the light reception unit 520, and output the image signal to a column line (not shown) in response to a select signal applied through a row line (not shown). The output unit 530 may include a reset transistor, a driver transistor and a selection transistor. The reset transistor, the driver transistor and the selection transistor may share an active region 531, and include a reset gate RG, a driver gate DG and a selection gate SG, respectively. The driver gate DG may be positioned at the center of the active region 531, and the reset gate RG and the selection gate SG may be positioned at one side and the other side of the driver gate DG in a second direction D2, respectively. Junction regions (that is, sources and drains) may be formed in the active region 531 at both sides of the reset gate RG, the driver gate DG and the selection gate SG. The conductive line 550 may be coupled to the junction region (for example, source) at one side of the reset gate RG and to the driver gate DG, and the column line may be coupled to the junction region at the other side of the selection gate SG. A power supply voltage (VDD) may be applied to the junction region between the driver gate DG and the reset gate RG. The row line may be coupled to the selection gate SG. The output unit 530 may be positioned at one side of the light reception unit 520 in a first direction D1. The first direction D1 and the second direction D2 may be the column direction CD and the row direction RD, respectively.

The conductive line 550 may electrically couple the floating diffusion FD of the light reception unit 520 with the driver gate DG and the source of the reset transistor of the output unit 530.

The pickup unit 540 may control the base potential of the light reception unit 520 and the output unit 530, and may include a pickup region 541. The pickup region 541 may include an impurity region which is formed in a substrate. A predetermined bias, for example, a ground voltage (VSS), may be applied to the substrate formed with the light reception unit 520 and the output unit 530, through the pickup region 541. Similarly to the output unit 530, the pickup unit 540 may be positioned at one side of the light reception unit 520 in the first direction D1, side by side with the output unit 530. That is to say, the pickup unit 540 may be positioned on the same line with the output unit 530 in the second direction D2.

Referring to FIG. 7, the image sensor in accordance with the second embodiment may include a color filter array 600 corresponding to the pixel array 500. The color filter array 600 may include a plurality of color patterns 610 which are arranged repeatedly to correspond to the plurality of pixel blocks 510, respectively. Each of the plurality of color patterns 610 may include a plurality of color filters 621 to 624 corresponding to a plurality of unit pixels, respectively. Each of the plurality of color filters 621 to 624 may be a single filter including any one or a multi-filter including at least two, selected from the group consisting of a red filter, a green filter, a blue filter, a cyan filter, a yellow filter, a magenta filter, a white filter, a black filter, an IR cutoff filter, an IR pass filter and a band pass filter which passes a specific wavelength band. For example, each of the plurality of color patterns 610 may include a first color filter 621 to a fourth color filter 624 which are arranged in a 2×2 matrix structure and correspond to a plurality of unit pixels, respectively. In each of the plurality of color patterns 610, the first color filter 621, the second color filter 622, the third color filter 623 and the fourth color filter 624 may be positioned at a left upper part, a right upper part, a left lower part and a right lower part, respectively, and may have the same layout shape over the entire color filter array 600. For example, each of the plurality of color patterns 610 may be a Bayer pattern in which RGr/BGb are repeated. In other words, the first color filter 621, the second color filter 622, the third color filter 623 and the fourth color filter 624 may be a first green filter Gr, a red filter R, a blue filter B and a second green filter Gb, respectively.

Meantime, while the second embodiment illustrates the case where each of the plurality of color patterns 610 is a Bayer pattern, it is to be noted that various color patterns may be applied. For example, each of the plurality of color patterns 610 may be a WRGB pattern which includes a white filter W, a red filter R, a green filter G and a blue filter B.

Referring again to FIG. 6, in the image sensor in accordance with the second embodiment, in order to prevent differences from being caused in the image signals outputted from respective unit pixels as a shared pixel structure is adopted, the plurality of pixel blocks 510 in each sub pixel array 505 may have planar shapes that are symmetrical to each other.

In detail, each of the plurality of sub pixel arrays 505 may include the plurality of pixel blocks 510 which are arranged in the M×N (where M and N are natural numbers) matrix structure. Among the plurality of pixel blocks 510, when compared to an (M,N) pixel block 510, the planar shape of an (M,N+1) pixel block 510 may be one that is obtained by inverting the planar shape of the (M,N) pixel block 510 in the N direction. The planar shape of an (M+1,N) pixel block 510 may be one that is obtained by inverting the planar shape of the (M,N) pixel block 510 in the M direction. The planar shape of an (M+1,N+1) pixel block 510 may be one that is obtained by inverting the planar shape of the (M+1,N) pixel block 510 in the N direction. In other words, among the plurality of pixel blocks 510, when compared to the planar shape of the (M,N) pixel block 510, the (M,N+1) pixel block 510 may have a planar shape that is symmetrical to the (M,N) pixel block 510 in the first direction D1, and the (M+1,N) pixel block 510 may have a planar shape that is symmetrical to the (M,N) pixel block 510 in the second direction D2. The (M+1,N+1) pixel block 510 may have a planar shape that is symmetrical to the (M+1,N) pixel block 510 in the first direction D1.

Accordingly, the driving circuit 560 of the (M,N) of the (M+1,N) pixel block 510 may be positioned at first respective side (e.g., upper side) of the light reception unit 520 of the (M,N) and the (M+1,N) pixel block 510 in the N direction. Whereas, the driving circuit 560 of the (M,N+1) of the (M+1,N+1) pixel block 510 may be positioned at the second respective side (e.g., lower side) of the light reception unit 520 of the (M,N+1) and the (M+1,N+1) pixel block 510 in the N direction. Moreover, the light reception unit 520 of the (M,N) pixel block 510 and the light reception unit 520 of the (M,N+1) pixel block 510 may be aligned in the M direction, and the light reception unit 520 of the (M+1,N) pixel block 510 and the light reception unit 520 of the (M+1,N+1) pixel block 510 may be aligned in the M direction. Also, the driving circuit 560 of the (M,N+1) and the (M+1,N) pixel block 510 may be aligned in the M direction. The N direction and the M direction may be the first direction D1 and the second direction D2, respectively, and the first direction D1 and the second direction D2 may be the column direction CD and the row direction RD, respectively.

For example, each of the plurality of sub pixel arrays 505 may Include a (1,1) first pixel block 510-1, a (1,2) second pixel block 510-2, a (2,1) third pixel block 510-3 and a (2,2) fourth pixel block 510-4 which may be arranged in a 2×2 matrix structure. The planar shape of the second pixel block 510-2 may be one that is obtained by inverting the planar shape of the first pixel block 510-1 in the first direction D1. The planar shape of the third pixel block 510-3 may be one that is obtained by inverting the planar shape of the first pixel block 510-1 in the second direction D2. The planar shape of the fourth pixel block 510-4 may be one that is obtained by inverting the planar shape of the third pixel block 510-3 in the first direction D1. The second pixel block 510-2 may have a planar shape that is symmetrical to the first pixel block 510-1 in the first direction D1. In other words, the second pixel block 510-2 may have a planar shape that is up-down symmetrical to the first pixel block 510-1. The third pixel block 510-3 may have a planar shape that is symmetrical to the first pixel block 510-1 in the second direction D2. In other words, the third pixel block 510-3 may have a planar shape that is left-right symmetrical to the first pixel block 510-1. The fourth pixel block 510-4 may have a planar shape that is symmetrical to the third pixel block 510-3 in the first direction D1. In other words, the fourth pixel block 510-4 may have a planar shape that is up-down symmetrical to the third pixel block 510-3. The fourth pixel block 510-4 may have a planar shape that is symmetrical to the first pixel block 510-1 in the first direction D1 and the second direction D2.

Accordingly, the driving circuit 560 of the first pixel block 510-1 and the driving circuit 560 of the third pixel block 510-3 may be positioned at the upper sides of the light reception unit 520 of the first pixel block 510-1 and the light reception unit 520 of the third pixel block 510-3, respectively, while the driving circuit 560 of the second pixel block 510-2 and the driving circuit 560 of the fourth pixel block 510-4 may be positioned at the lower sides of the light reception unit 520 of the second pixel block 510-2 and the light reception unit 520 of the fourth pixel block 510-4, respectively. In each of the driving circuits 560 of the first pixel block 510-1 and the second pixel block 510-2, the output unit 530 and the pickup unit 540 may be positioned at a left side and a right side, respectively, and, in each of the driving circuits 560 of the third pixel block 510-3 and the fourth pixel block 510-4, the output unit 530 and the pickup unit 540 may be positioned at a right side and a left side, respectively. The light reception unit 520 of the first pixel block 510-1 and the light reception unit 520 of the second pixel block 510-2 may be aligned in a left to right direction, and the light reception unit 520 of the third pixel block 510-3 and the light reception unit 520 of the fourth pixel block 510-4 may be aligned in a left to right direction. The driving circuit 560 of the second pixel block 510-2 and the driving circuit 560 of the third pixel block 510-3 may be aligned in a left to right direction.

In the image sensor in accordance with the second embodiment, in each of the plurality of sub pixel arrays 505, when the first unit pixels 521-1, 521-2, 521-3 and 521-4 are disposed at a shortest distance from the driving circuits 560, for example, the output unit 530, while the fourth unit pixels 524-1, 524-2, 524-3 and 524-4 are disposed at a longest distance from the driving circuits 560, the first pixel block 510-1 to the fourth pixel block 510-4 may have planar shapes that are symmetrical to each other. Therefore, the layout of the plurality of unit pixels in the first pixel block 510-1, the layout of the plurality of unit pixels in the second pixel block 510-2, the layout of the plurality of unit pixels in the third pixel block 510-3 and the layout of the plurality of unit pixels in the fourth pixel block 510-4 may be all different.

For example, in the first pixel block 510-1, the first unit pixel 521-1, the second unit pixel 522-1, the third unit pixel 523-1 and the fourth unit pixel 524-1 may be positioned at a left upper part, a right upper part, a left lower part and a right lower part, respectively. In the second pixel block 510-2, the first unit pixel 521-2, the second unit pixel 522-2, the third unit pixel 523-2 and the fourth unit pixel 524-2 may be positioned at a left lower part, a right lower part, a left upper part and a right upper part, respectively. In the third pixel block 510-3, the first unit pixel 521-3, the second unit pixel 522-3, the third unit pixel 523-3 and the fourth unit pixel 524-3 may be positioned at a right upper part, a left upper part, a right lower part and a left lower part, respectively. In the fourth pixel block 510-4, the first unit pixel 521-4, the second unit pixel 522-4, the third unit pixel 523-4 and the fourth unit pixel 524-4 may be positioned at a right lower part, a left lower part, a right upper part and a left upper part, respectively. In this regard, while, in the comparative example, the positions of the first unit pixel 121 to the fourth unit pixel 124 are all the same in the plurality of respective pixel blocks 110, in the present second embodiment, it may be seen that the positions of the first unit pixels 521-1, 521-2, 521-3 and 521-4 to the fourth unit pixels 524-1, 524-2, 524-3 and 524-4 in the first pixel block 510-1 to the fourth pixel block 510-4 are all different.

Accordingly, the colors of color filters corresponding to unit pixels of the same position in the first pixel block 510-1 to the fourth pixel block 510-4 are the same. In detail, the first color filter 621 of FIG. 7 may correspond to each of the first unit pixel 521-1 of the first pixel block 510-1, the third unit pixel 523-2 of the second pixel block 510-2, the second unit pixel 522-3 of the third pixel block 510-3 and the fourth unit pixel 524-4 of the fourth pixel block 510-4. The first color filter 622 may correspond to each of the second unit pixel 522-1 of the first pixel block 510-1, the fourth unit pixel 524-2 of the second pixel block 510-2, the first unit pixel 521-3 of the third pixel block 510-3 and the third unit pixel 523-4 of the fourth pixel block 510-4. The third color filter 623 may correspond to each of the third unit pixel 523-1 of the first pixel block 510-1, the first unit pixel 521-2 of the second pixel block 510-2, the fourth unit pixel 524-3 of the third pixel block 510-3 and the second unit pixel 522-4 of the fourth pixel block 510-4. The fourth color filter 624 may correspond to each of the fourth unit pixel 524-1 of the first pixel block 510-1, the second unit pixel 522-2 of the second pixel block 510-2, the third unit pixel 523-3 of the third pixel block 510-3 and the first unit pixel 521-4 of the fourth pixel block 510-4.

In this way, in the image sensor in accordance with the second embodiment, while all the positions of the first unit pixels 521-1, 521-2, 521-3 and 521-4 to the fourth unit pixels 524-1, 524-2, 524-3 and 524-4 in the respective pixel blocks 510 of each sub pixel array 505 are different, because color patterns 610 corresponding to the respective pixel blocks 510 retain a predetermined pattern, it is possible to prevent differences from being caused in the image signals outputted from the respective unit pixels, even though the shared pixel structure is adopted. In detail, in the sub pixel array 505, unit pixels corresponding to color filters of the same color, for example, the first unit pixel 521-1 in the first pixel block 510-1, the third unit pixel 523-2 in the second pixel block 510-2, the second unit pixel 522-3 in the third pixel block 510-3 and the fourth unit pixel 524-4 in the fourth pixel block 510-4 corresponding to first color filters 621 cannot help but have different planar shapes. Namely, the distance between the first unit pixel 521-1 and the output unit 530 in the first pixel block 510-1, the distance between the third unit pixel 523-2 and the output unit 530 in the second pixel block 510-2, the distance between the second unit pixel 522-3 and the output unit 530 in the third pixel block 510-3 and the distance between the fourth unit pixel 524-4 and the output unit 530 in the fourth pixel block 510-4 cannot help but be different from one another. Due to this fact, the image signals outputted by the first unit pixel 521-1 in the first pixel block 510-1, the third unit pixel 523-2 in the second pixel block 510-2, the second unit pixel 522-3 in the third pixel block 510-3 and the fourth unit pixel 524-4 in the fourth pixel block 510-4 cannot help but be different from one another. By merging the different image signals outputted from the unit pixels of the first pixel block 510-1, the second pixel block 510-2, the third pixel block 510-3 and the fourth pixel block 510-4 by the unit of at least one sub pixel array 505, it is possible to prevent differences from being caused in the image signals outputted from the respective unit pixels. In particular, because the image sensor in accordance with the second embodiment includes the first unit pixels 521-1, 521-2, 521-3 and 521-4 to the fourth unit pixels 524-1, 524-2, 524-3 and 524-4 corresponding to any one color filters having the same colors in the sub pixel array 505, it is possible to prevent effectively differences from being caused among image signals, when compared to the image sensor in accordance with the first embodiment of the present invention.

For reference, in the comparative example, an image signal corresponding to incident light discolored by any one color filter is outputted from only any one unit pixel having the same planar shape in each of the plurality of pixel blocks 110. However, in the image sensor in accordance with the second embodiment, since an image signal is outputted from a plurality of unit pixels which have different planar shapes, it is possible to prevent differences from being caused in the image signals outputted from the respective unit pixels.

Figure 8:
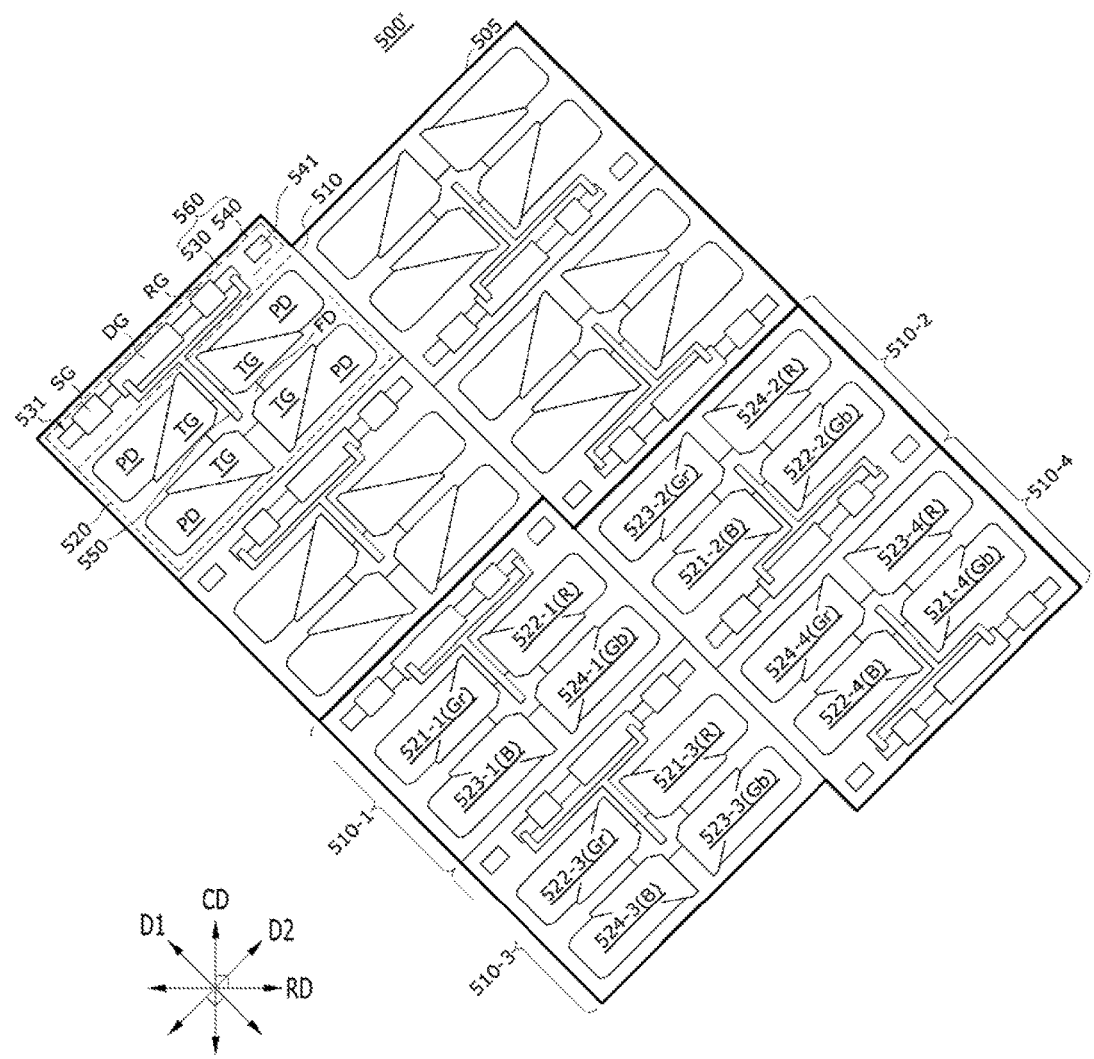
FIG. 8 is a plan view illustrating a portion of a pixel array of an image sensor in accordance with a variation of the second embodiment of the present invention.

FIG. 8 is a plan view illustrating a portion of a pixel array of an image sensor in accordance with a variation of the second embodiment of the present invention. For the sake of convenience in explanation, the same reference symbols as the second embodiment will be used herein.

Referring to FIG. 8, the image sensor in accordance with the variation of the second embodiment may include a pixel array 500' in which a plurality of sub pixel arrays 505 are arranged two-dimensionally. Each of the plurality of sub pixel arrays 505 may include a plurality of pixel blocks 510 which are arranged in an M×N (where M and N are natural numbers) matrix structure. That is to say, the pixel array 500' may include a plurality of pixel blocks 510 which are arranged in a first direction D1 and a second direction D2. The first direction D1 and the second direction D2 may be oblique directions that cross with each other and have slopes with respect to a row direction RD or a column direction CD. The pixel array 500' may more readily secure the layout and interval of wiring lines which extend in the row direction RD and the column direction CD.

In summary, while, in the second embodiment, the plurality of pixel blocks 510 in the sub pixel array 505 have planar shapes that are symmetrical in the row direction RD or/and the column direction CD, in this variation of the second embodiment, the plurality of pixel blocks 510 in the sub pixel array 505 may have planar shapes that are symmetrical in the first direction D1 or/and the second direction D2 which are oblique directions relatively to the row and the column directions.

The image sensor in accordance with embodiments of the present invention may be used in various electronic devices or systems. Hereafter, a camera including an image sensor in accordance with an embodiment of the present invention will be described with reference to FIG. 9.

Figure 9:
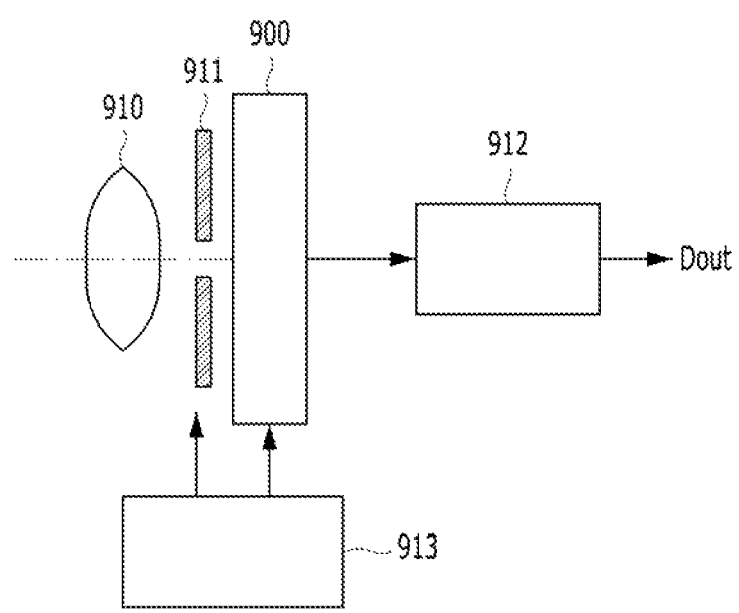
FIG. 9 is a diagram schematically Illustrating an electronic device including an image sensor in accordance with an embodiment of the present invention.

FIG. 9 is a diagram schematically illustrating an electronic device including an image sensor in accordance with an embodiment of the present invention. Referring to FIG. 9, the electronic device including the image sensor in accordance with embodiments of the present invention may be a camera capable of taking a still image or a moving image. The electronic device may include an optical system or optical lens 910, a shutter unit 911, a driving unit 913 for controlling/driving the image sensor 900 and the shutter unit 911, and a signal processing unit 912.

The optical system 910 may guide image light from an object to a pixel array of the image sensor 900. The optical system 910 may include a plurality of optical lenses. The shutter unit 911 may control a light irradiation period and a light shield period for the image sensor 900. The driving unit 913 may control a transmission operation of the image sensor 900 and a shutter operation of the shutter unit 911. The signal processing unit 912 may process signals outputted from the image sensor 900 in various manners. The processed image signals Dout may be stored in a storage medium such as a memory or outputted to a monitor or the like.

As is apparent from the above descriptions, in the present technology, since a sub pixel array including a plurality of pixel blocks which have symmetric planar shapes is provided, it is possible to prevent differences from being caused in the image signals outputted from respective unit pixels.

Although various embodiments have been described for illustrative purposes, it will be apparent to those skilled in the art that various changes and modifications may be made without departing from the spirit and scope of the invention as defined in the following claims.

What is claimed is:
1. An image sensor comprising:
a pixel array including a plurality of sub pixel arrays arranged two-dimensionally,
wherein each of the plurality of sub pixel arrays includes a first pixel block and a second pixel block adjacent to the first pixel block in a row direction, and
wherein each of the first and second pixel blocks comprises:
a light reception unit including first to fourth unit pixels arranged in 2×2 matrix structure; and
a driving circuit,
wherein:
the driving circuit of the first pixel block is positioned at an upper side of the light reception unit of the first pixel block,
the driving circuit of the second pixel block is positioned at a lower side of the light reception unit of the first pixel block,
the upper side of the first pixel block and an upper side of the second pixel block are aligned with each other in the row direction, and
a lower side of the first pixel block and the lower side of the second pixel block are aligned with each other in the row direction.

2. The image sensor according to claim 1, wherein each of the plurality of sub pixel arrays further comprises a third pixel block and a fourth pixel block adjacent to the third pixel block in the row direction,
wherein:
the first pixel block and the third pixel block are adjacent to each other in a column direction, and the second pixel block and the fourth pixel block are adjacent to each other in the column direction,
wherein each of the third and fourth pixel blocks comprises a light reception unit including first to fourth unit pixels arranged in 2×2 matrix structure, and a driving circuit,
the driving circuit of the third pixel block is positioned at an upper side of the light reception unit of the third pixel block, the driving circuit of the fourth pixel block is positioned at a lower side of the light reception unit of the fourth pixel block.

3. The image sensor according to claim 2,
wherein:
the upper side of the third pixel block and an upper side of the fourth pixel block are aligned with each other in the row direction, and
a lower side of the third pixel block and the lower side of the fourth pixel block are aligned with each other in the row direction.

4. The image sensor according to claim 3,
wherein the light reception unit of the first pixel block and the light reception unit of the second pixel block are positioned side-by-side in the row direction, and
wherein the light reception unit of the third pixel block and the light reception unit of the fourth pixel block are positioned side-by-side in the row direction.

5. The image sensor according to claim 4, wherein the driving circuit of the second pixel block and the driving circuit of the third pixel block are aligned with each other in the row direction.

6. The image sensor according to claim 1, further comprising:
a color filter array corresponding to the pixel array,
wherein the color filter array comprises a plurality of color patterns which are arranged repeatedly to correspond to the plurality of pixel blocks, respectively, and
wherein each of the plurality of color patterns includes a plurality of color filters corresponding to the plurality of unit pixels, respectively.

7. The image sensor according to claim 1, wherein:
the unit pixels in each of the first and second pixel blocks have a first unit pixel and a second unit pixel in a first row, and a third unit pixel and a fourth unit pixel in a second row, wherein the first unit pixel and the third unit pixel are positioned in a first column, and the second unit pixel and the fourth unit pixel are positioned in a second column, and
a first distance between the first unit pixel in the first pixel block and the driving circuit of the first pixel block is different from a second distance between the first unit pixel in the second pixel block and the driving circuit of the second pixel block.

8. An image sensor comprising:
a pixel array including a plurality of pixel blocks arranged in a matrix structure,
wherein each of the plurality of pixel blocks includes a first pixel block and a second pixel block adjacent to the first pixel block in a row direction, and
wherein each of the first and second pixel blocks comprises:
a light reception unit including a first unit pixel to a fourth unit pixel which generate photocharges in response to incident light and are arranged in a 2×2 matrix structure; and
a driving circuit suitable for outputting an image signal corresponding to the photocharges,
wherein:
the driving circuit of the first pixel block is positioned at an upper side of the light reception unit of the first pixel block,
the driving circuit of the second pixel block is positioned at a lower side of the light reception unit of the first pixel block, a planar configuration of the light receiving unit of the first pixel block and a planar configuration of the light receiving unit of the second pixel block have a same arrangement, and a first distance between the first unit pixel of the first pixel block and a driver gate of the driving circuit of the first pixel block is different from a second distance between the first unit pixel of the second pixel block and a driver gate of the driving circuit of the second pixel block.

9. The image sensor according to claim 8, further comprising:

a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters which correspond to the first to the fourth unit pixels.

10. The image sensor according to claim 9, wherein:

the first unit pixel, the second unit pixel, the third unit pixel and the fourth unit pixel in the first pixel block are positioned at a left upper position, a right upper position, a left lower position and a right lower position, respectively, and the first unit pixel, the second unit pixel, the third unit pixel and the fourth unit pixel in the second pixel block are positioned at a left lower position a right lower position a left upper position and a right upper position, respectively.

11. The image sensor according to claim 10, wherein color filters corresponding to unit pixels of the same position in the first pixel block and the second pixel block, respectively, are the same in color.

12. The image sensor according to claim 10, wherein colors of color filters respectively corresponding to the first unit pixel of the first pixel block and the third unit pixel of the second pixel block are the same, wherein colors of color filters respectively corresponding to the second unit pixel of the first pixel block and the fourth unit pixel of the second pixel block are the same, wherein colors of color filters respectively corresponding to the third unit pixel of the first pixel block and the first unit pixel of the second pixel block are the same, and wherein colors of color filters respectively corresponding to the fourth unit pixel of the first pixel block and the second unit pixel of the second pixel block are the same.

13. An image sensor comprising:

a pixel array including first to fourth pixel blocks arranged in a matrix structure, the second pixel block adjacent to the first pixel block in a row direction has a planar configuration that is up-down symmetrical to a planar configuration of the first pixel block, the third pixel block adjacent to the first pixel block in a column direction has a planar configuration that is left-right symmetrical to the planar configuration of the first pixel block, and the fourth pixel block adjacent to the second pixel block and the third pixel block in the column direction and the row direction, respectively, has a planar configuration that is up-down symmetrical to the planar configuration of the third pixel block, wherein each of the first to fourth pixel blocks comprises:

a light reception unit including a first unit pixel to a fourth unit pixel which generate photocharges in response to incident light and are arranged in a 2×2 matrix structure; and a driving circuit suitable for outputting an image signal corresponding to the photocharges.

14. The image sensor according to claim 13, wherein the driving circuit of the first pixel block and the driving circuit of the third pixel block are positioned at upper sides of the light reception unit of the first pixel block and the light reception unit of the third pixel block, respectively, and wherein the driving circuit of the second pixel block and the driving circuit of the fourth pixel block are positioned at lower sides of the light reception unit of the second pixel block and the light reception unit of the fourth pixel block, respectively.

15. The image sensor according to claim 14, wherein the light reception unit of the first pixel block and the light reception unit of the second pixel block are aligned in a left to right direction, and the light reception unit of the third pixel block and the light reception unit of the fourth pixel block are aligned in a left to right direction.

16. The image sensor according to claim 15, wherein the driving circuit of the second pixel block and the driving circuit of the third pixel block are aligned in a left to right direction.

17. The image sensor according to claim 13, further comprising:

a color filter array corresponding to the pixel array, wherein the color filter array comprises a plurality of color patterns which are arranged repeatedly to correspond to the plurality of pixel blocks, respectively, and wherein each of the plurality of color patterns comprises a plurality of color filters which correspond to the first to the fourth unit pixels.

18. The image sensor according to claim 17, wherein, when, in each of the plurality of pixel blocks, a center of the first unit pixel is positioned at a shortest distance from a driver gate of the driving circuit and a center of the fourth unit pixel is positioned at a longest distance from the driver gate of the driving circuit, the first unit pixel, the second unit pixel, the third unit pixel and the fourth unit pixel in the first pixel block are positioned at a left upper position a right upper position a left lower position and a right lower position respectively;

the first unit pixel, the second unit pixel, the third unit pixel and the fourth unit pixel in the second pixel block are positioned at a left lower position, a right lower position, a left upper position and a right upper position, respectively;

the first unit pixel, the second unit pixel, the third unit pixel and the fourth unit pixel in the third pixel block are positioned at a right upper position a left upper position a right lower position and a left lower position respectively; and the first unit pixel, the second unit pixel, the third unit pixel and the fourth unit pixel in the fourth pixel block are positioned at a right lower position, a left lower position, a right upper position and a left upper position, respectively.

19. The image sensor according to claim 18, wherein color filters corresponding to unit pixels of the same position in the first pixel block to the fourth pixel block, respectively, are the same in color.

20. The image sensor according to claim 18,
wherein colors of color filters respectively corresponding to the first unit pixel of the first pixel block, the third unit pixel of the second pixel block, the second unit pixel of the third pixel block and the fourth unit pixel of the fourth pixel block are the same,
wherein colors of color filters respectively corresponding to the second unit pixel of the first pixel block, the fourth unit pixel of the second pixel block, the first unit pixel of the third pixel block and the third unit pixel of the fourth pixel block are the same,
wherein colors of color filters respectively corresponding to the third unit pixel of the first pixel block, the first unit pixel of the second pixel block, the fourth unit pixel of the third pixel block and the second unit pixel of the fourth pixel block are the same, and
wherein colors of color filters respectively corresponding to the fourth unit pixel of the first pixel block, the second unit pixel of the second pixel block, the third unit pixel of the third pixel block and the first unit pixel of the fourth pixel block are the same.

* * * * *